United States Patent [19]

Brandewie

[11] Patent Number: 5,006,479
[45] Date of Patent: Apr. 9, 1991

[54] METHODS FOR IMPROVING RADIATION TOLERANCE OF SILICON GATE CMOS/SILICON ON SAPPHIRE DEVICES

[75] Inventor: Jerry V. Brandewie, Mission Viejo, Calif.

[73] Assignee: Rockwell International Corporation, El Segundo, Calif.

[21] Appl. No.: 485,687

[22] Filed: Feb. 27, 1990

[51] Int. Cl.⁵ .................. H01L 21/266; H01L 21/223; H01L 21/336
[52] U.S. Cl. ........................ 437/45; 437/67; 437/57; 437/27; 437/84; 148/DIG. 150; 148/DIG. 131
[58] Field of Search ........... 148/DIG. 150, DIG. 131; 357/23.12; 437/56, 57, 58, 59, 29, 45, 41, 84, 62, 67, 27

[56] References Cited

U.S. PATENT DOCUMENTS

| | | | |
|---|---|---|---|
| 4,070,211 | 1/1978 | Harari | 148/DIG. 150 |
| 4,160,260 | 7/1979 | Weitzel et al. | 148/DIG. 150 |
| 4,753,896 | 6/1988 | Matloubian | 437/29 |

OTHER PUBLICATIONS

Wolf, S., *Silicon Processing for the VSLI Era*, vol. 1, Lattice Press, 1986, pp. 264–265, 280–327.
Capell, A. et al., "Process Refinements ... ", Electronics, May 26, 1977, pp. 99–105.

*Primary Examiner*—Brian E. Hearn
*Assistant Examiner*—T. N. Quach
*Attorney, Agent, or Firm*—H. Frederick Hamann; George A. Montanye; Wilfred G. Caldwell

[57] ABSTRACT

The radiation hardened NFET and process of the subject Methods and Structures for Improving Radiation Tolerance of Silicon Gate CMOS/Silicon on Sapphire Devices utilizes boron edge doping of a silicon epi island on sapphire at the island opposed edges in the region which will be the P-doped region of the finished transistor. Multiple boron ion implants are made into the silicon adjacent to the active region and driven-in to provide a uniform edge doping. Alternatively, a furnace containing a source of boron vapor and the sapphire wafer is used to dope the island edges at high temperatures.

6 Claims, 12 Drawing Sheets

METHODS FOR IMPROVING RADIATION TOLERANCE OF SILICON GATE CMOS/SILICON ON SAPPHIRE DEVICES

BACKGROUND OF THE INVENTION

1. Field of the Invention

This invention teaches control of doping of the vertical edge transistor of CMOS/SOS to increase the edge NFET threshold voltage to total dose radiation to preclude radiation induced leakage.

2. Prior Art

It is known that the SOS N-channel silicon gate transistor is actually three transistors in parallel. The primary top channel transistor is the intentional transistor and the two parasitic transistors comprise a back channel transistor at the epitaxial silicon-sapphire interface and edge transistor along the edge of the silicon islands — each of these transistors contributes to the radiation induced leakage.

It is well known to minimize the radiation degradation due to the primary top channel transistor and the back channel transistor. But control of the leakage from these transistors is not adequate because total dose radiation results have consistently shown that edge leakage can often be the dominant source of leakage induced radiation failures.

Conventional implant techniques are used to control the surface doping and thus, the threshold voltage of the top channel transistor. However, it is extremely difficult to control doping of the vertical edge transistor. A direct implant is obviously not possible along the 0.6 micron or so thick edge. But it is known that radiation induced edge leakage currents could be reduced if a technique could be defined for doping the island edges to increase the edge NFET threshold voltage.

SUMMARY OF THE INVENTION

Two techniques have been defined for selectively doping only the vertical NFET transistor surface on vertically edge structures. Boron edge doping is used indirectly as derived from multiple implants into the silicon and laterally diffused prior to island etching. The silicon islands are formed and their edges are verticalized by reactive ion etching. The active regions of the NFETs are shielded by silicon nitride, and boron ions are implanted along the edges thereof with energies ranging between approximately 20 Kev and 50 Kev using a dose of $10^{14}$–$10^{17}$ ions per $cm^2$. Two or more implants are established at different energy levels within the, e.g., 20 to 50 Kev in order that a more uniform rather than a peaked distribution will be available. The doping is driven in an inert atmosphere to attain approximately 0.10 micron penetration from each side.

In contrast, a direct boron edge doping is available using high temperature boron nitride processing (wherein photoresist won't take the high temperature and cannot act as a shield to block the PFET leaving only the NFET exposed). Here again, the boron is placed in the edges of the silicon island to adjust the voltage threshold to a high enough value to avoid leakage.

These principles are different from the top surface which has an orientation of $<100>$ because the leakage sides are oriented at $<110>$ or $<111>$ and there is a difference of thickness of oxide and the $Q_{ss}$ has a different effect on the threshold voltage, but the principles herein teach the use of these two doping methods to produce an edge hardened device.

BRIEF DESCRIPTION OF THE DRAWINGS

FIG. 24 shows metal deposit and etch for the contacts with the contacts being filled in.

DETAILED DESCRIPTION OF A PREFERRED EMBODIMENT OF THE INVENTION

Figure 1:
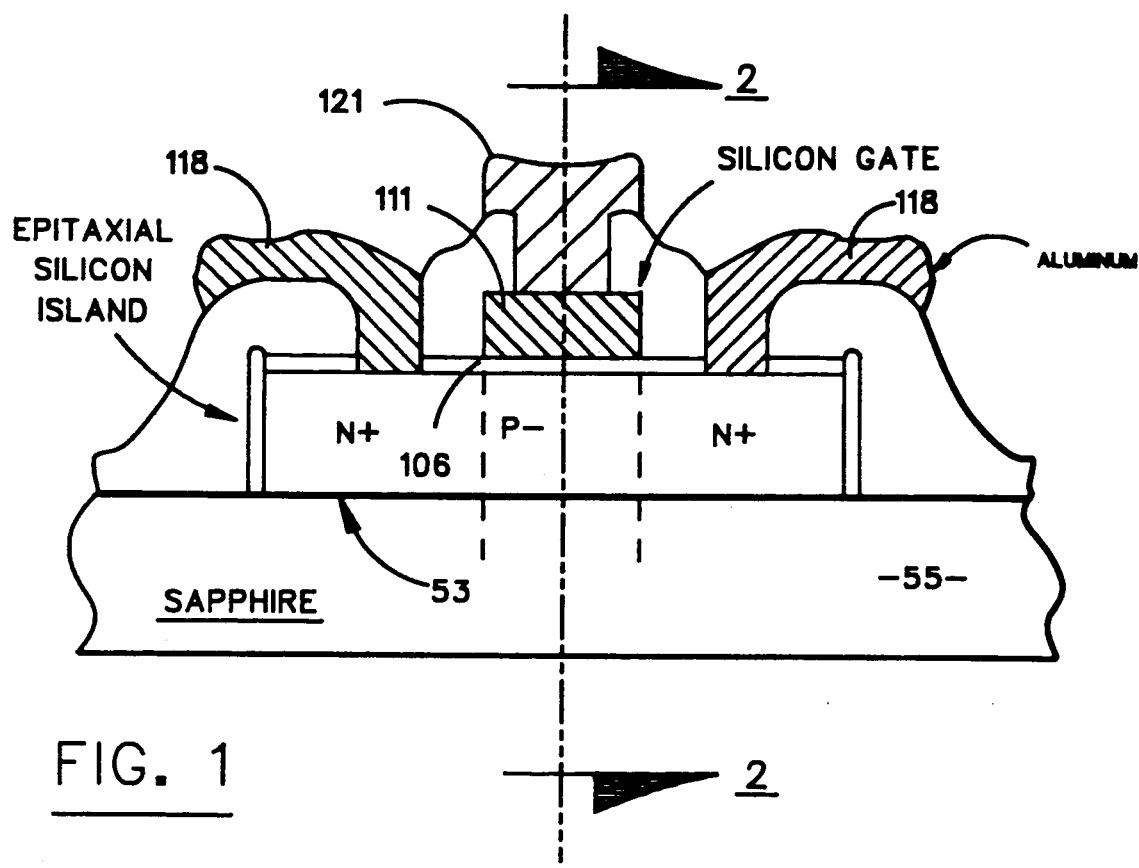
FIG. 1 is a sectional view of an epitaxial silicon island NPN silicon gate transistor on sapphire.

In FIG. 1, there is shown a sectional view of the NFET which has been further hardened by P-doping in the edges of the island only at the region which will become the P-doped region (i.e.) in the edges which would be parallel to the plane of the paper.

Sapphire wafer 55 supports epitaxial silicon layer 53 with 106 being the gate oxide, 111 the gate poly, 118 the metallization contacts to the source and drain (being isolated of course) and 121 the contact to the gate.

Figure 2:
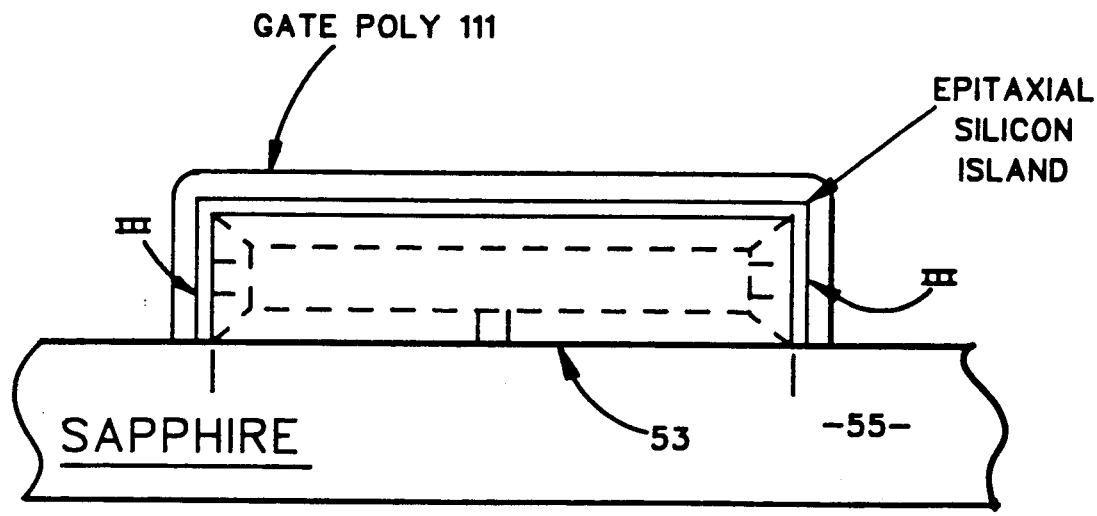
FIG. 2 is a cross-sectional view of the structure of FIG. 1 up through the gate poly, taken on the plane 2—2.

In FIG. 2, the gate poly is visible over the island 53. The edges being doped for hardening are III.

Figure 3:
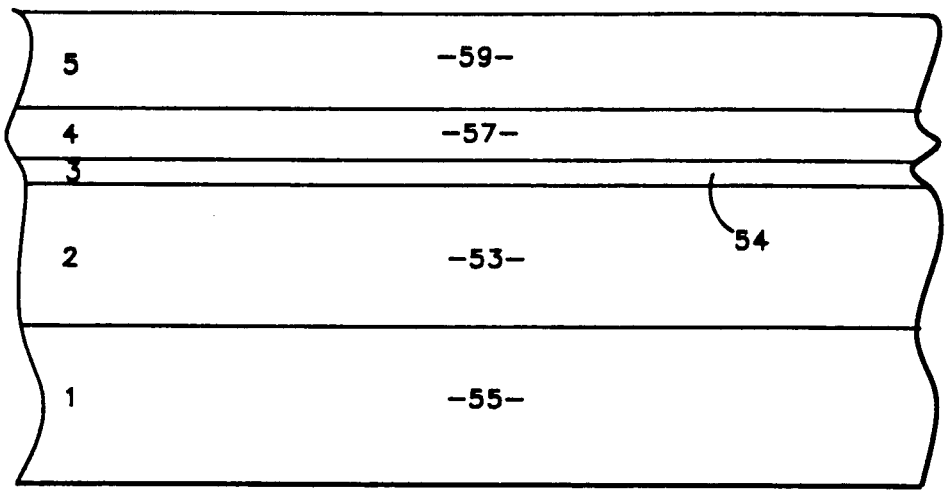
FIG. 3 shows a first step in forming the CMOS devices by laying down or growing various layers.

In FIG. 3 there is shown a sapphire support 55 with an epitaxial layer of silicon 53 thereover. A thin thermal oxide layer 54 is grown on top of the silicon and an optional silicon nitride layer 57 is deposited over the thermal oxide. A low temperature oxide layer 59 is deposited over the silicon nitride layer 57.

Figure 4:
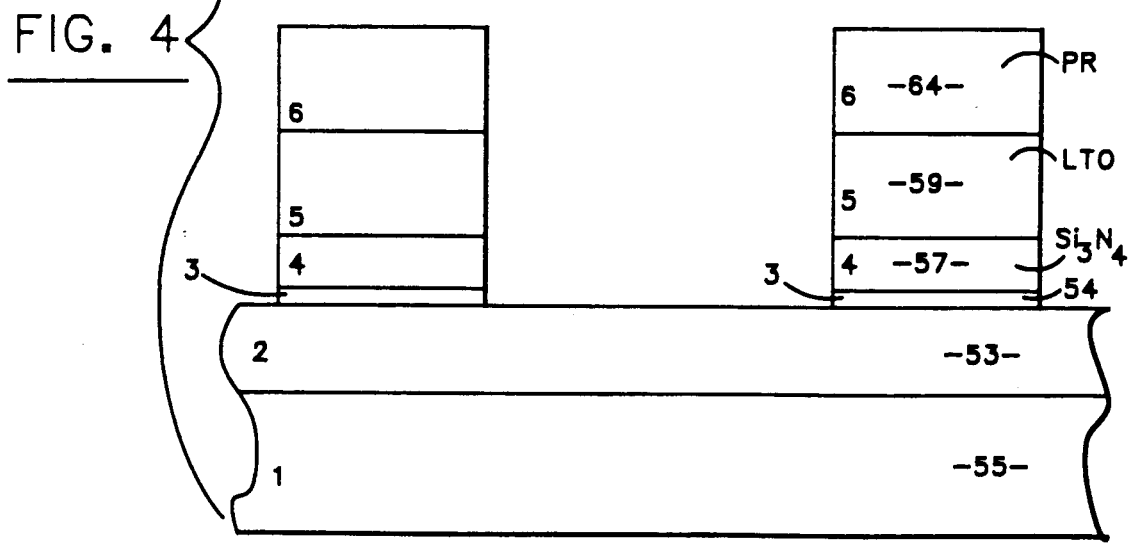
FIG. 4 shows the active regions delineated from these layers for a PFET and an NFET.

In FIG. 4, identical or the same masks 63 and 61 are provided to delineate the active regions respectively for the NFETs and PFETs being formed, using photoresist 64 in conventional fashion.

FIGS. 1-6 define the first option for increasing the P-type doping concentration at the island edges of the N-channel devices which subsequently results in an increase in the threshold voltage of the positive N-channel edge transistor. This option of FIGS. 1-6 utilizes multiple boron implants of different energy levels to establish a uniform profile within the NFET silicon island which is driven in by heating in an inert, i.e., nitrogen environment.

Thus, in FIG. 4, mask 61 defines not only the active region of the PFET being formed but also an individual silicon island for this PFET. It should be noted that many FETs may be formed on islands but for purposes of illustrating the principles of this invention, a single FET is formed for each island. Thus, mask 63 defines the NFET island.

Masks 61 and 63 are used with a conventional photoresist masking step and reactive ion etching through the oxide layer 54, silicon nitride layer 57, low temperature oxide layer 59 to develop the structure of FIG. 4, layer 64 is the photo sensitive material, i.e., photoresist.

Figure 5:
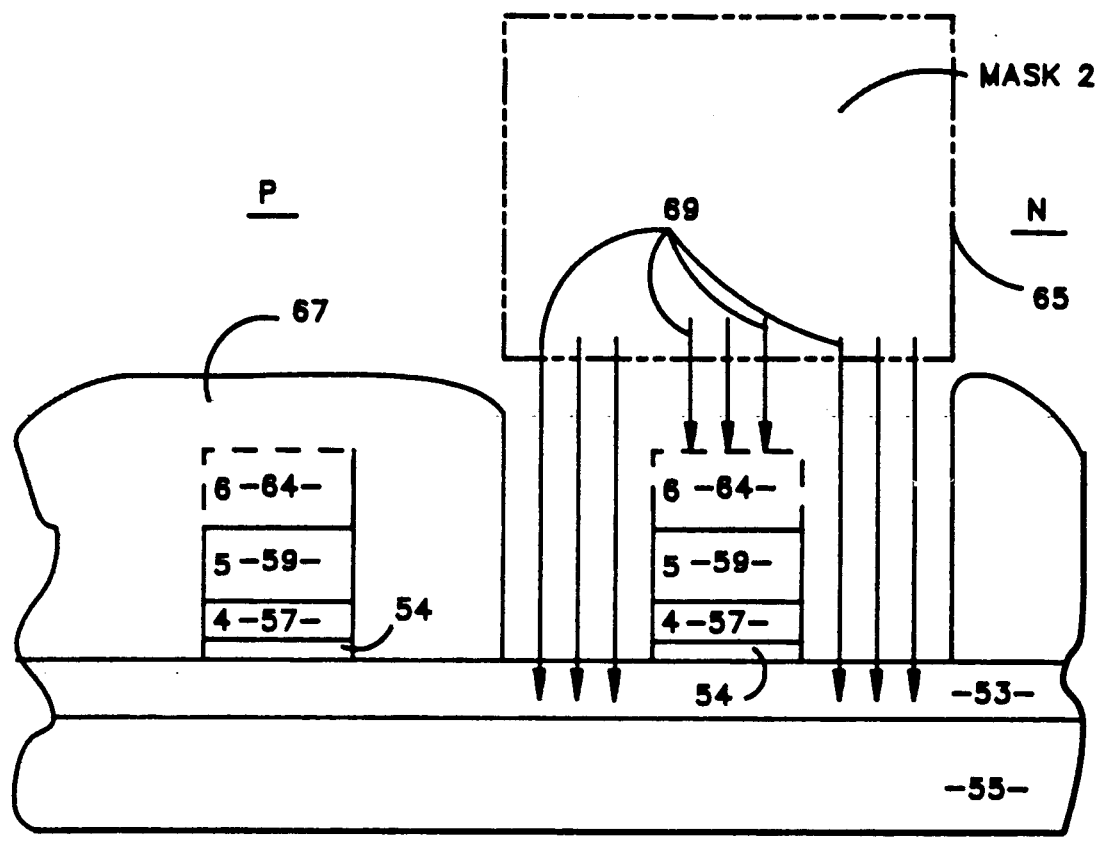
FIG. 5 shows the PFET under construction covered by photoresist with the NFET transistor being formed subjected to multiple energy boron implants, the NFET body being blocked from boron by oxide and photoresist.

In FIG. 5, the structure is shown after removing the masks 61 and 63 photoresist and subsequently utilizing mask 65 which is an open mask to the photoresist 67 protecting the P-channel device and open the N-channel device for the multiple energy boron implant (indicated by arrows 69 into the exposed epitaxial silicon 53 which is blocked by either the photoresist or the nitride-oxide mask. The specific implant conditions are dependent upon epi thickness, subsequent process conditions and desired device performance, but by way of example, at least two, and three or more if desired, implants are carried out at different implant energies. For example, the first implant might be at 20 Kev, the second at 40 Kev and the third at 50 Kev in order to provide a uniform distribution of ions having a dose of $10^{15}$ through $10^{17}$ ions per cm$^2$ for drive in. The boron doping is confined to the region which will subsequently become the P-doped region by subsequent use of mask.

Figure 6:
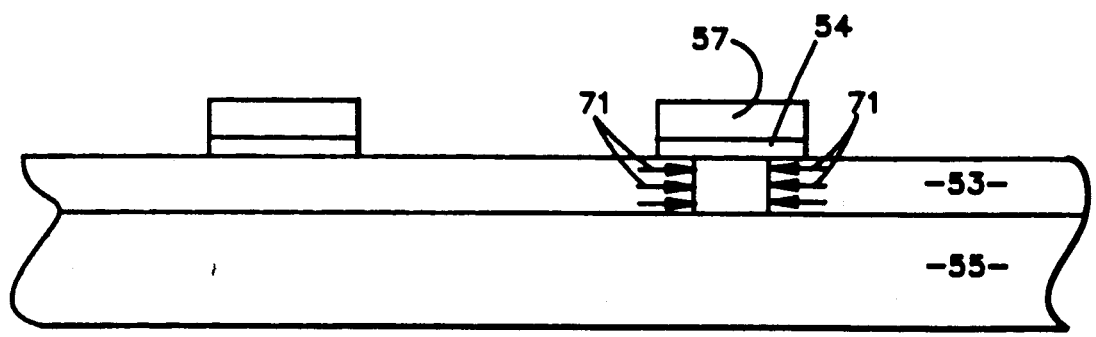
FIG. 6 shows the structure of FIG. 5 after removal of the photoresist and subsequent high temperature exposure to produce the required lateral diffusion of the P-type dopant under the island definition masking.

In FIG. 6, the structure is shown after removal of the photoresist 64 and low temperature oxide 59. However, the oxide 59 need not be removed. The doping is driven in to determine the amount of concentration and diffusion at a temperature in the range 850° C. to 1000° C. for a period of up to two hours. preferably in nitrogen or other inert atmosphere. This drive in is indicated by the arrows 71 in this silicon (P to be region of) 53 in FIG. 6. The desired drive in penetration beneath the active area along the edges is of the order of 0.10 to 0.20 micron.

Figure 7:
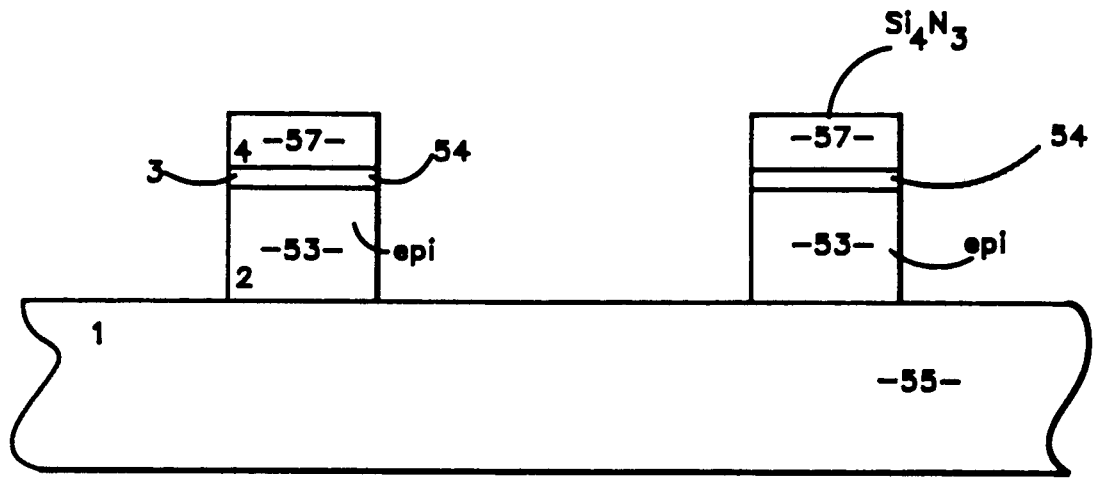
FIG. 7 shows the structure following reactive ion etching of the epitaxial silicon retaining the P-type doping at the island edges of the NFET.

In FIG. 7, the structure following reactive ion etching of the epitaxial silicon is shown with the retained P-type doping within the island edges at 71' (FIG. 8) in the region which will become the P-doped region.

Figure 8:
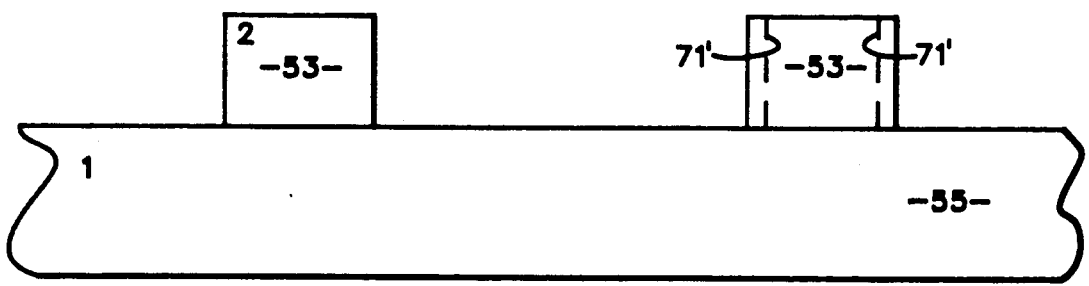
FIG. 8 shows the structure after removal of the masking oxide-nitride ready for process completion using conventional CMOS/SOS procedures set forth in FIGS. 15-24.

In FIG. 8, the masking oxide-nitride layers 57 and 54 have been removed so that the NMOS and PMOS being formed are ready for conventional CMOS/SOS processing into devices.

FIGS. 9-14 reveal the processing for the second boron edge doping direct method in contrast to the indirect method of option 1 set forth in FIGS. 3-8.

Figure 9:
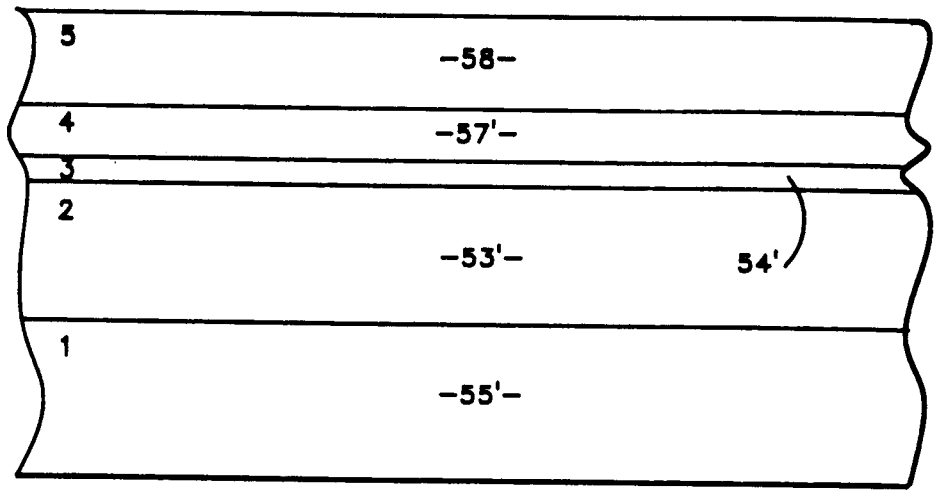
FIG. 9 shows the basic layout of the layers for the second type boron doping to eliminate radiation hardness problems due to leakage in the edge transistors.

In FIG. 9, the basic layout of the layers for the second type boron doping to eliminate radiation hardness problems due to leakage in the edge transistors is presented. Sapphire substrate 55' carries epitaxial silicon layer 53', in turn supporting the thermally grown thin oxide 54' covered by silicon nitride 57', in turn covered by masking LPCVD silicon oxide 58.

Figure 10:
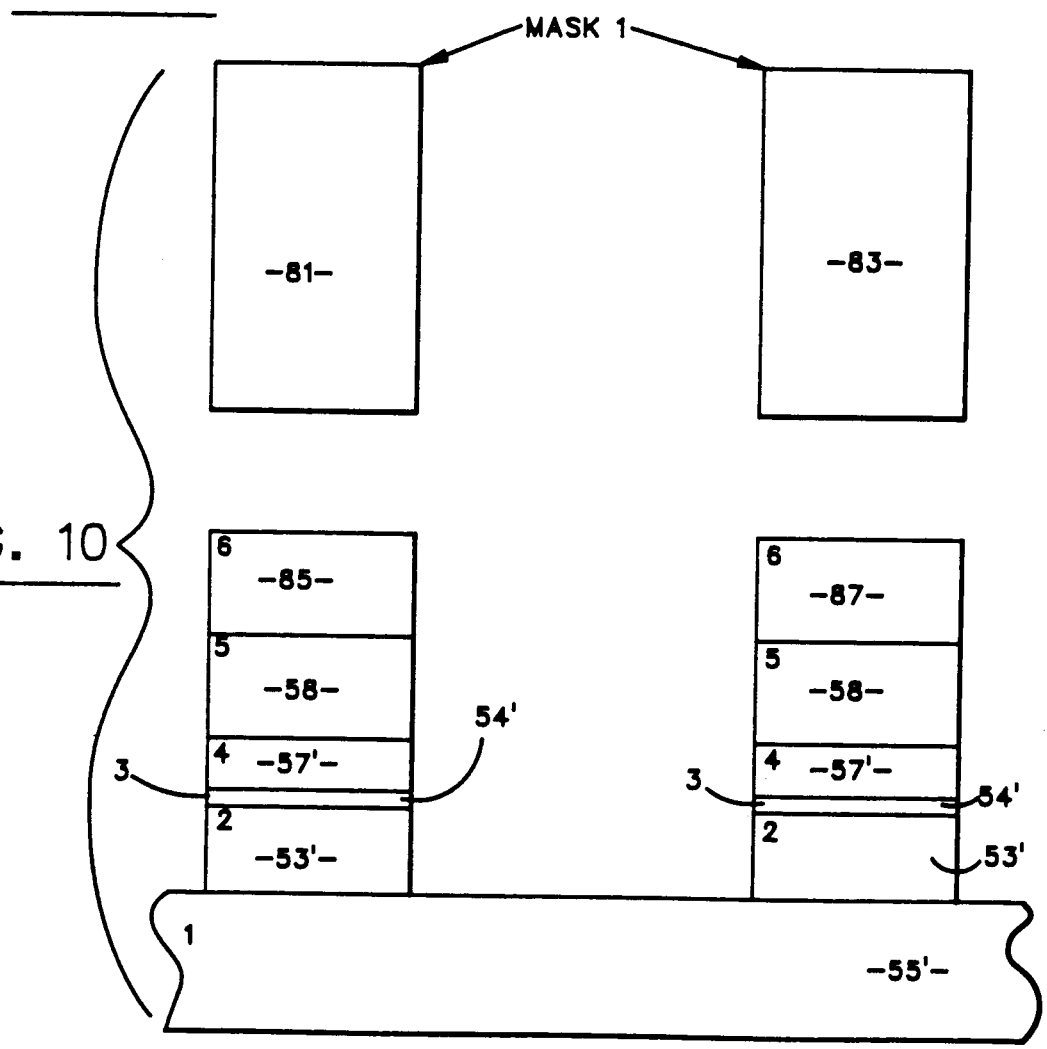
FIG. 10 shows the structure of FIG. 9 after photoresist masking and reactive ion etching through the oxide-nitride-oxide epi silicon layers using mask 1 (the active or island mask)

In FIG. 10, mask 1 or the active or island mask, is shown at 81 and 83 respectively for the PFET and NFET under construction. In this figure, photoresist 85 and 87 protects the portions of the layers over the active regions while the rest of the structure is removed to bare sapphire 55'. Reactive ion etching extends through the oxide-nitride-oxide epi silicon layers using the masks 81 and 83.

Figure 11:
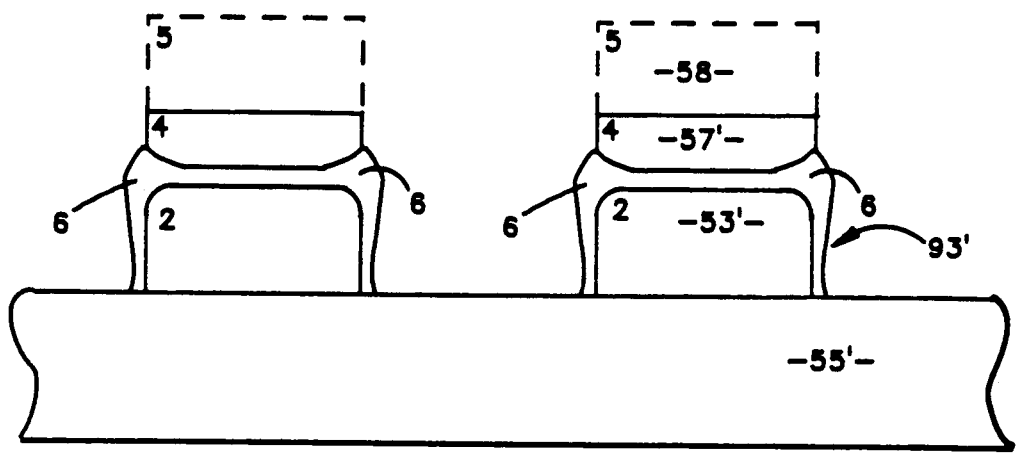
FIG. 11 shows the structure after removal of the photoresist and subsequent oxidation of the island edges using the nitride mask (the desired oxide thickness is dependent on masking requirement against dopants and other device performance)

FIG. 11 shows the structure after removal of the photoresist 85 and 87 and subsequent oxidation of the island edges using the nitride mask 57'. The desired oxide thickness is dependent on masking requirement against dopants and other device performance. This oxide is shown at 93'.

Figure 12:
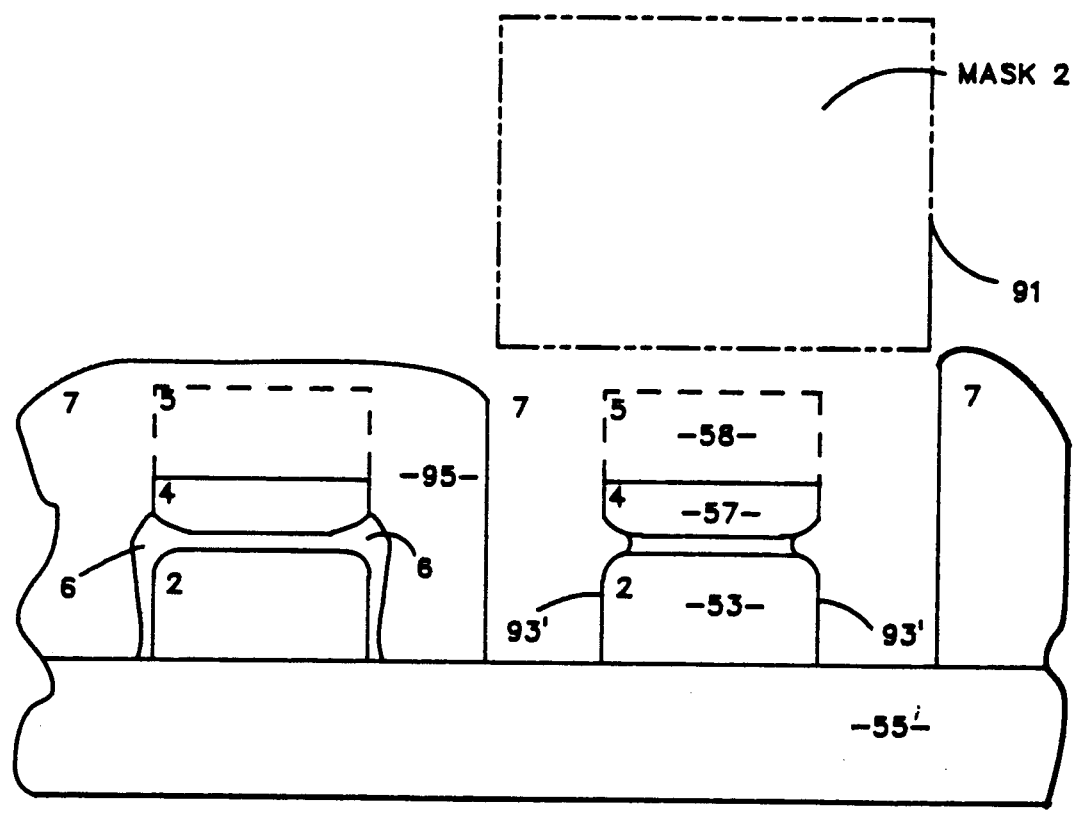
FIG. 12 shows the structure after photoresist masking with mask 2 (P-well mask) to block off all but the N-channel transistor sites, the oxide grown in FIG. 11 is then etched selectively from the edges of the N-channel device sites.
Figure 13:
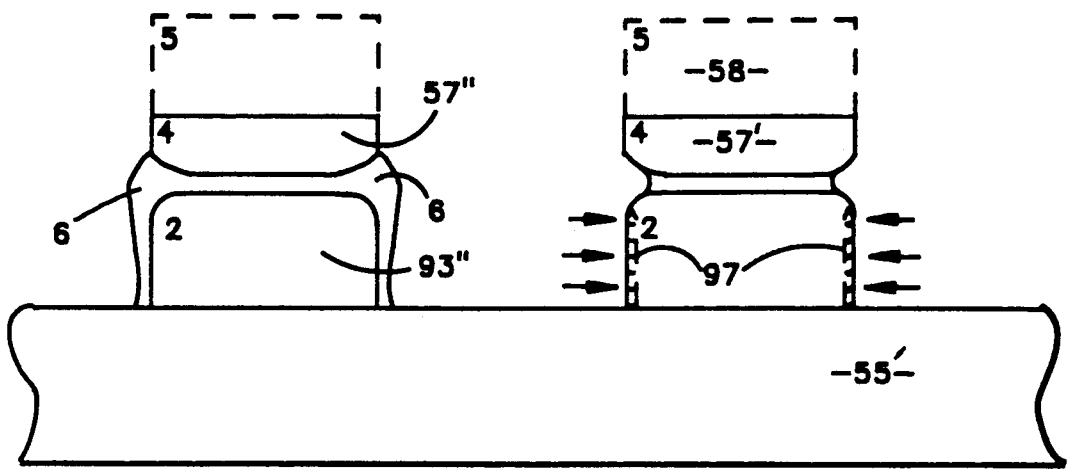
FIG. 13 shows the structure after removal of the photoresist and processing to provide P-type doping of the exposed island edges, obtainable, e.g., by using solid boron nitride disks in a high temperature furnace.

FIG. 12 shows the structure after photoresist masking with mask 2, the P-well masks, shown at 91, to cover the PFET by positive photoresist 95 and open the NFET. This P-well mask 91 blocks off all but the N-channel transistor sites. The oxide 93 grown in FIG. 11 is then etched selectively from the edges of the N-channel devices under construction. Thus, edges 93' are free of oxide. FIG. 13 shows the structure after removal of the photoresist 95 and processing to provide P-type doping of the exposed island edges at 97. One way of accomplishing this doping is by using solid boron nitride discs in a high temperature furnace. The boron 93 is driven in sufficiently to adjust the threshold voltage high enough to avoid leakage. The oxide 93" about the silicon PFET island protects the island during this oxidation. The boron nitride processing is accomplished in the temperature range of 700° C. to 800° C. and the photoresist previously used in option 1 would not be sufficient to withstand this temperature. The heating is continued until approximately up to 0.2 micron penetration by the boron is obtained from the boron vapor or gas phase dopant carried to the sides of the silicon island. At 800° this occurs in approximately 15 minutes using boron.

Figure 14:
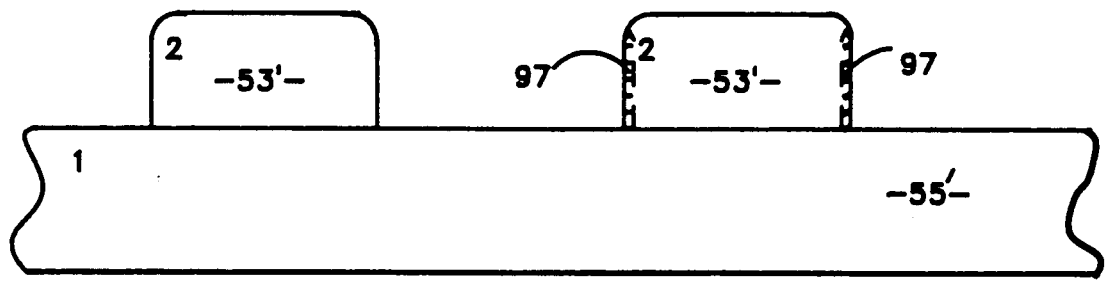
FIG. 14 shows the structure after removal of the mask oxide-nitride and ready for process completion with the conventional CMOS/SOS procedures of FIGS. 15-24.

Finally, in FIG. 14, the structure is shown after removal of the mask oxide-nitride 57′ so that the structure of FIG. 14 is ready for process completion using conventional CMOS/SOS procedures.

Figure 15:
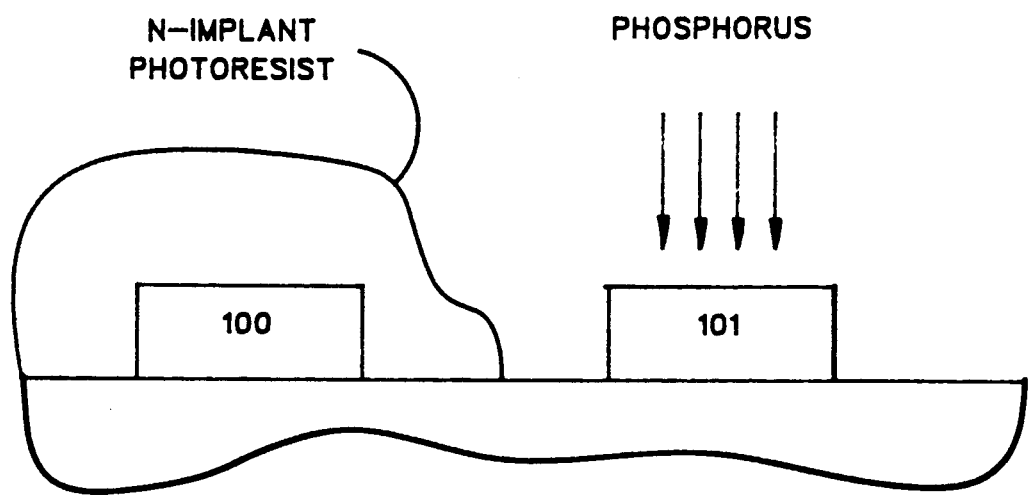
FIG. 15 shows on the left the N-channel being formed in an island covered by photoresist while the P-channel on the right is exposed to receive phosphorus doping.
Figure 16:
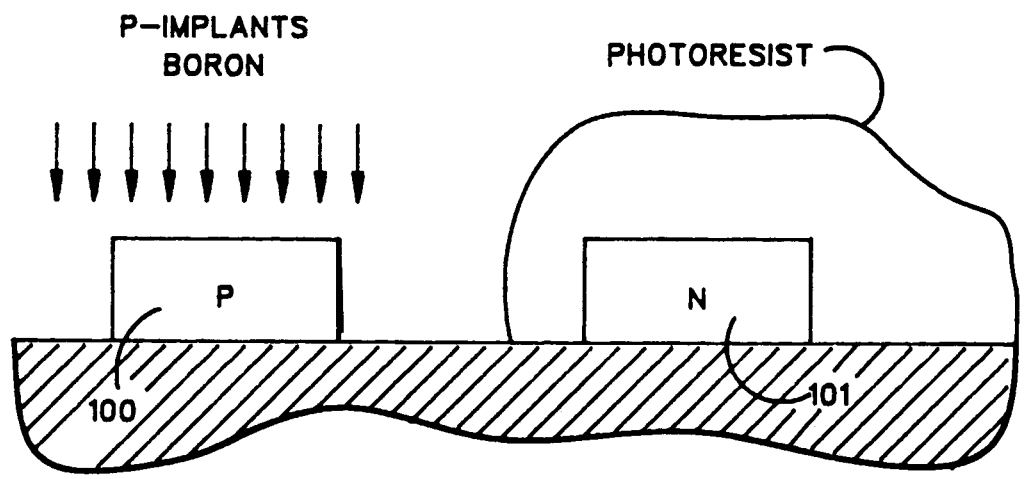
FIG. 16 shows the photoresist removed from the N-channel and covering the P-channel with implants of boron provided for post radiation leakage for the back of the NFET, not the edges, and a shallow implant for threshold adjustment.

In the conventional processing of FIGS. 15–24, it should be noted that the NFET is being processed on the left hand side and the PFET on the right hand side, just opposite from the preceding figures. FIGS. 15 and 16 show the doping of the adjacent islands 100 and 101 with FIG.d 15 showing island 100 protected and island 101 receiving phosphorus to dope it N-type.

Similarly, in FIG. 16, the N-channel FET island 100 is doped with boron to P-type. The phosphorus doping reaches the silicon sapphire interface for preRAD leakage and low energy boron at the surface. The boron doping of the N-channel is double and represents deep postRAD leakage for the back, not the edges, with the shallow doping being for threshold adjust.

Figure 17:
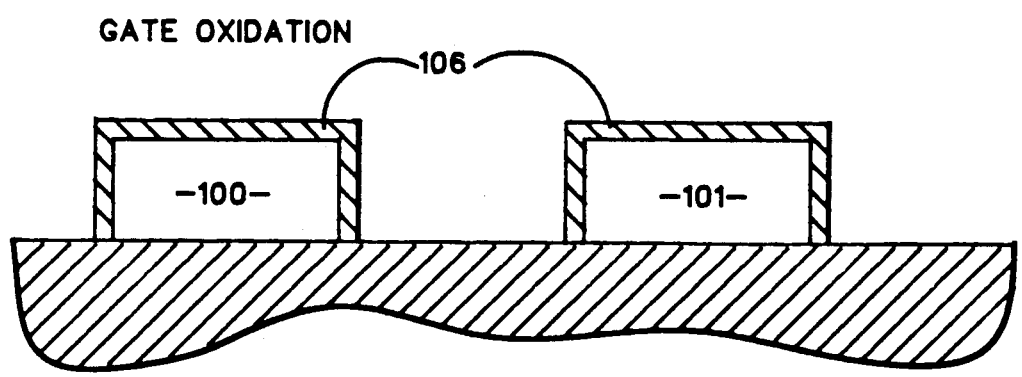
FIG. 17 shows the step of gate oxidation for both FETs.

In FIG. 17, the gate oxide 106 is grown to a thickness of about 250 Å at 875° C.

Figure 18:
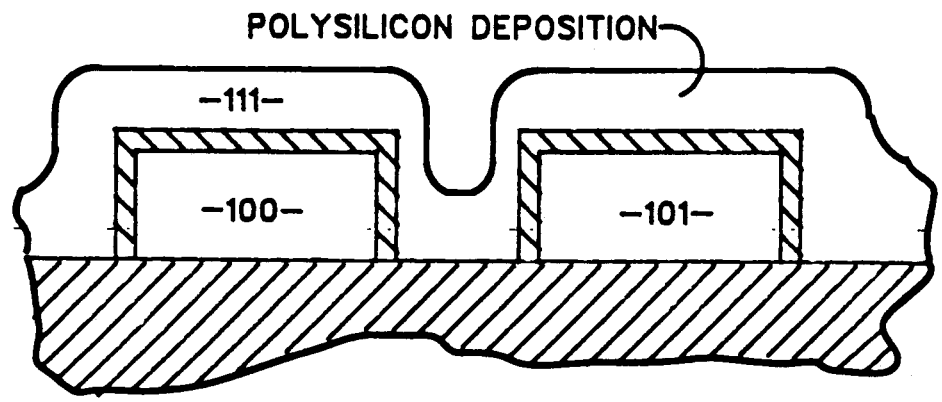
FIG. 18 shows the application of gate polysilicon by deposition.

In FIG. 18, gate poly 111 is deposited which is doped using phosphorus in a furnace basically for interconnects and contact continuity.

Figure 19:
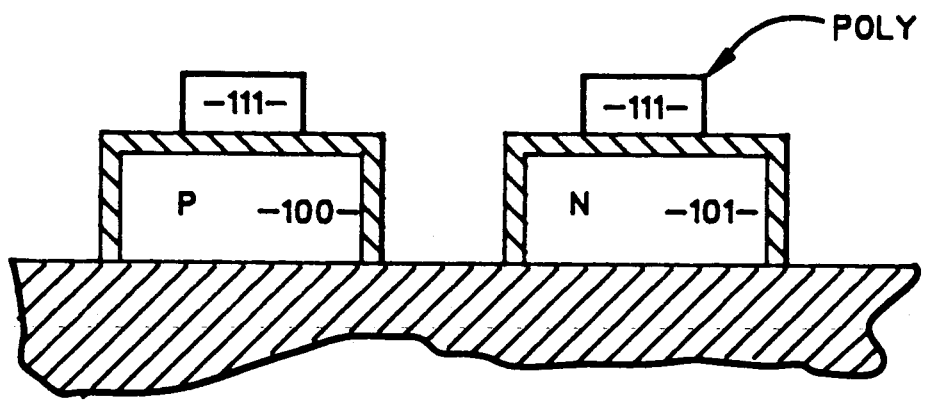
FIG. 19 shows a dry etch step vertically defining a 1.0 micron channel in both FETs.

In FIG. 19 dry etching is utilized to remove the excess poly and leave approximately 1.0 micron channels for both structures 100 and 101.

Figure 20:
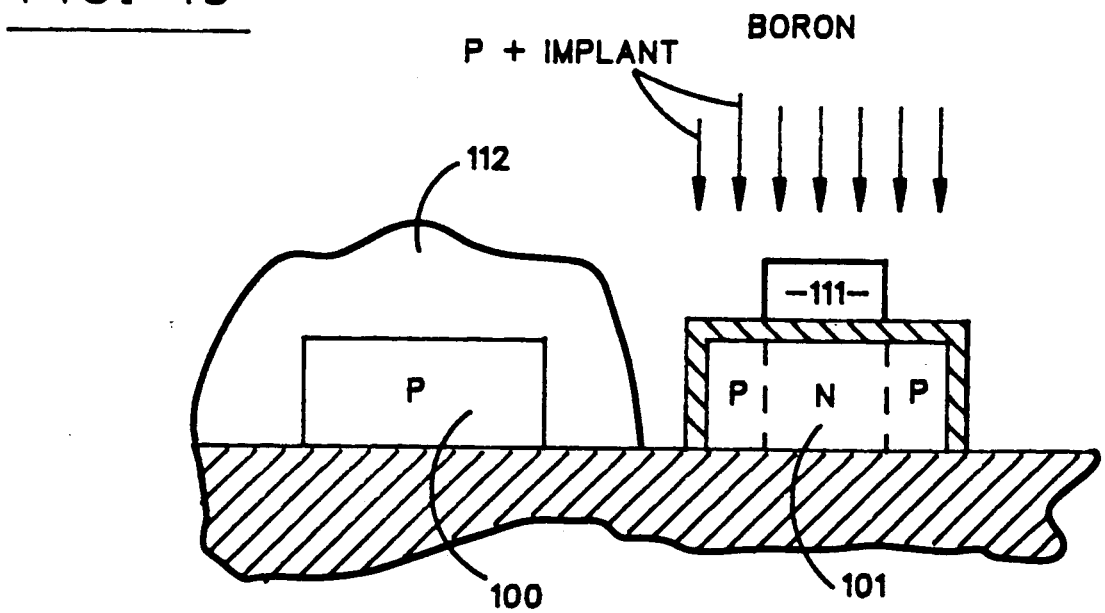
FIG. 20 shows the P-channel FET receiving boron ions for the source and drain implant.

In FIG. 20, boron is implanted into the P-channel device using the gate poly 111 as a shield so that it becomes doped PNP, resist 112 protecting the N-channel device. Thus, the source and drain implants are placed in the island 101.

Figure 21:
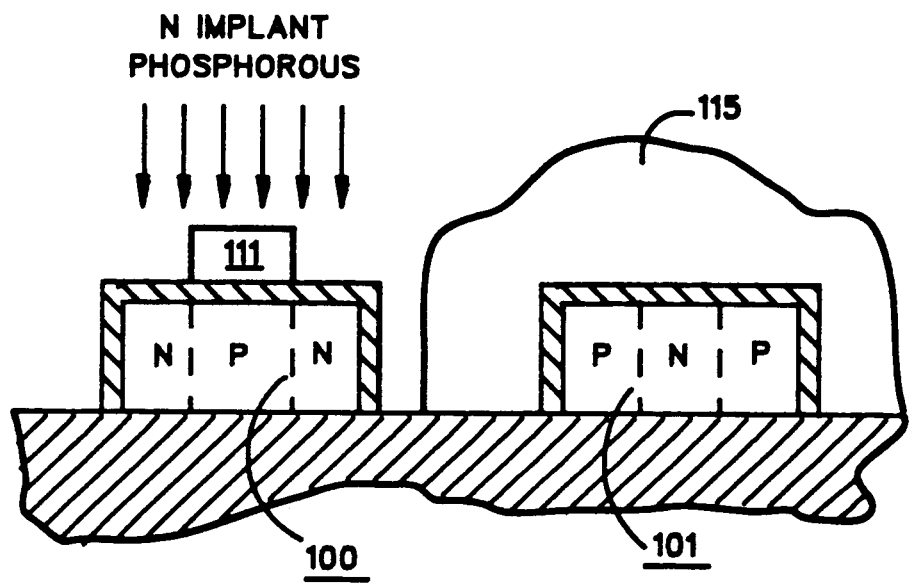
FIG. 21 shows the N+ implant by phosphorus for the N-channel device.

In FIG. 21, the right hand side is covered with resist 115 and the NFET is implanted with N+ phosphorus, again using the gate poly as a shield for the P-doped channel region thereby forming the source and drain.

Figure 22:
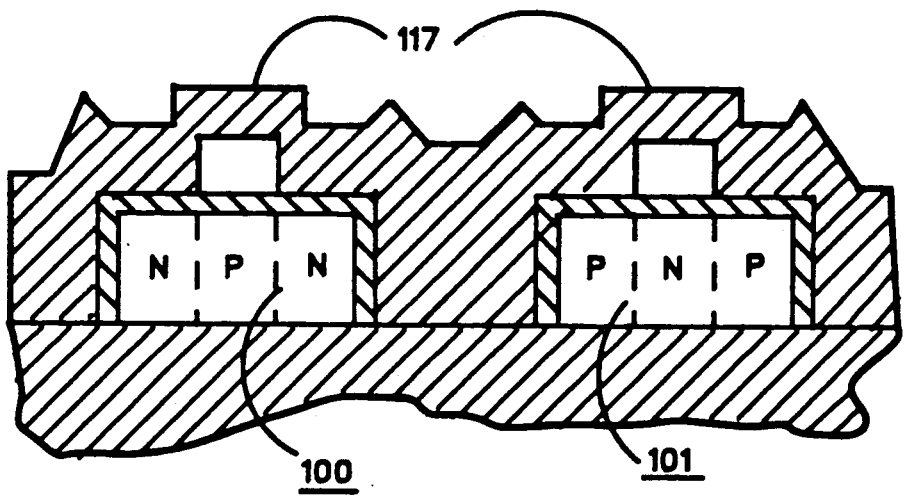
FIG. 22 shows the application of borophospho silicate glass to both FETs.

In FIG. 22, boro phospho silicate glass is deposited as glass, for example, at 600° C. and reflowed at below gate oxidation temperature, for example, 865° C. to achieve planarization for subsequent metal deposit. This glass is shown at 117.

Figure 23:
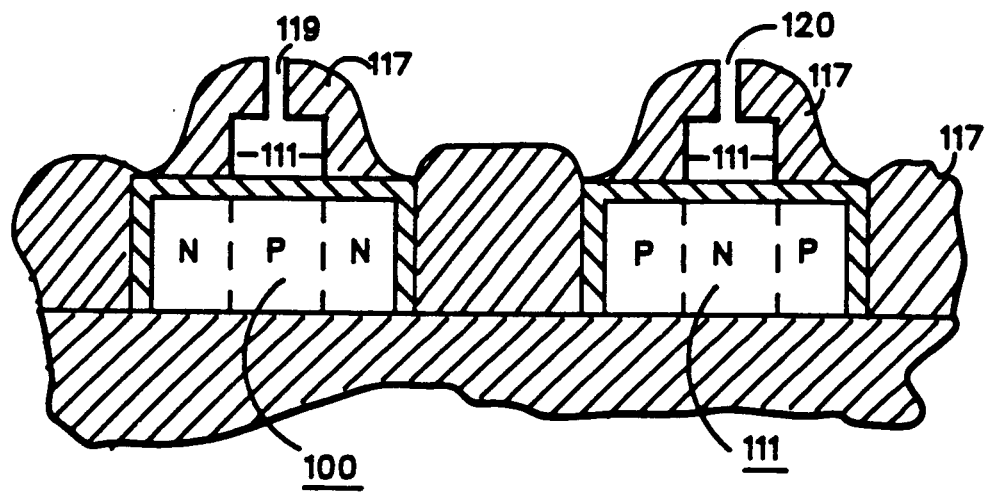
FIG. 23 shows the reactive ion etch step for contact etching.

In FIG. 23, reactive ion etching is carried out for contacts to the gate poly 111 for each device by forming the openings 119 for the left hand NFET and 120 for the right hand PFET.

Figure 24:
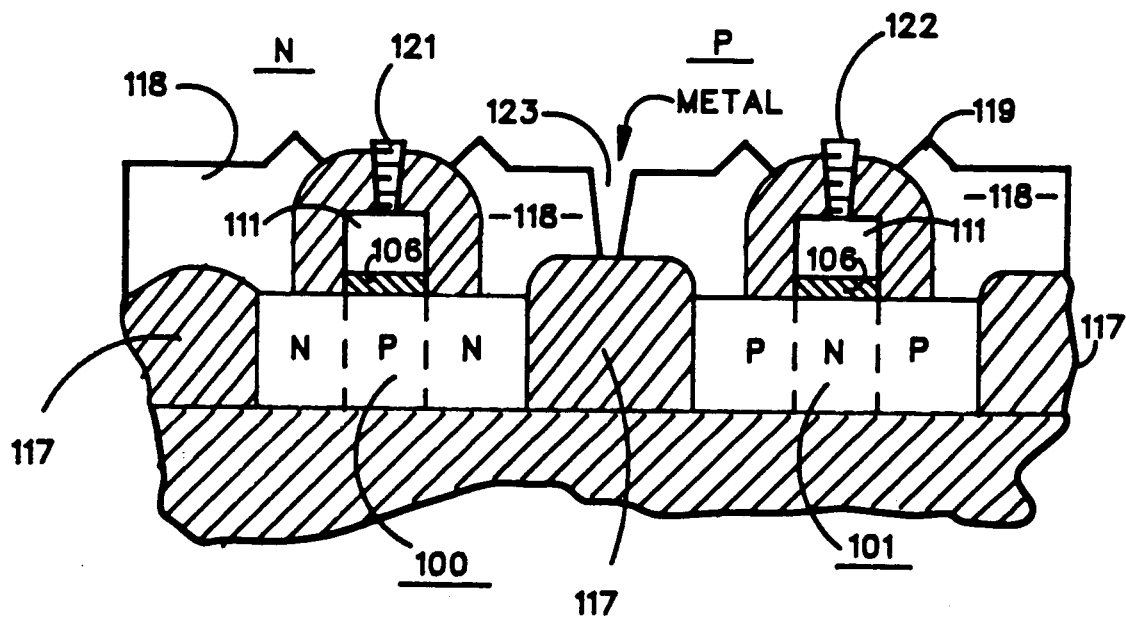

In FIG. 24, metal deposit and etching is shown wherein the NFET receives a metal contact 121 extending to the poly 111 and the PFET receives a contact 122 via the opening 120 to the poly 111 while the metal 118 is divided via aperture 123 in order that the respective drains and sources are served by alternate pieces of metal 118.

Note that the NFET edge doping cannot be illustrated in FIGS. 15–24 since these edges are parallel to the plane of the Figure.

Figure 25:
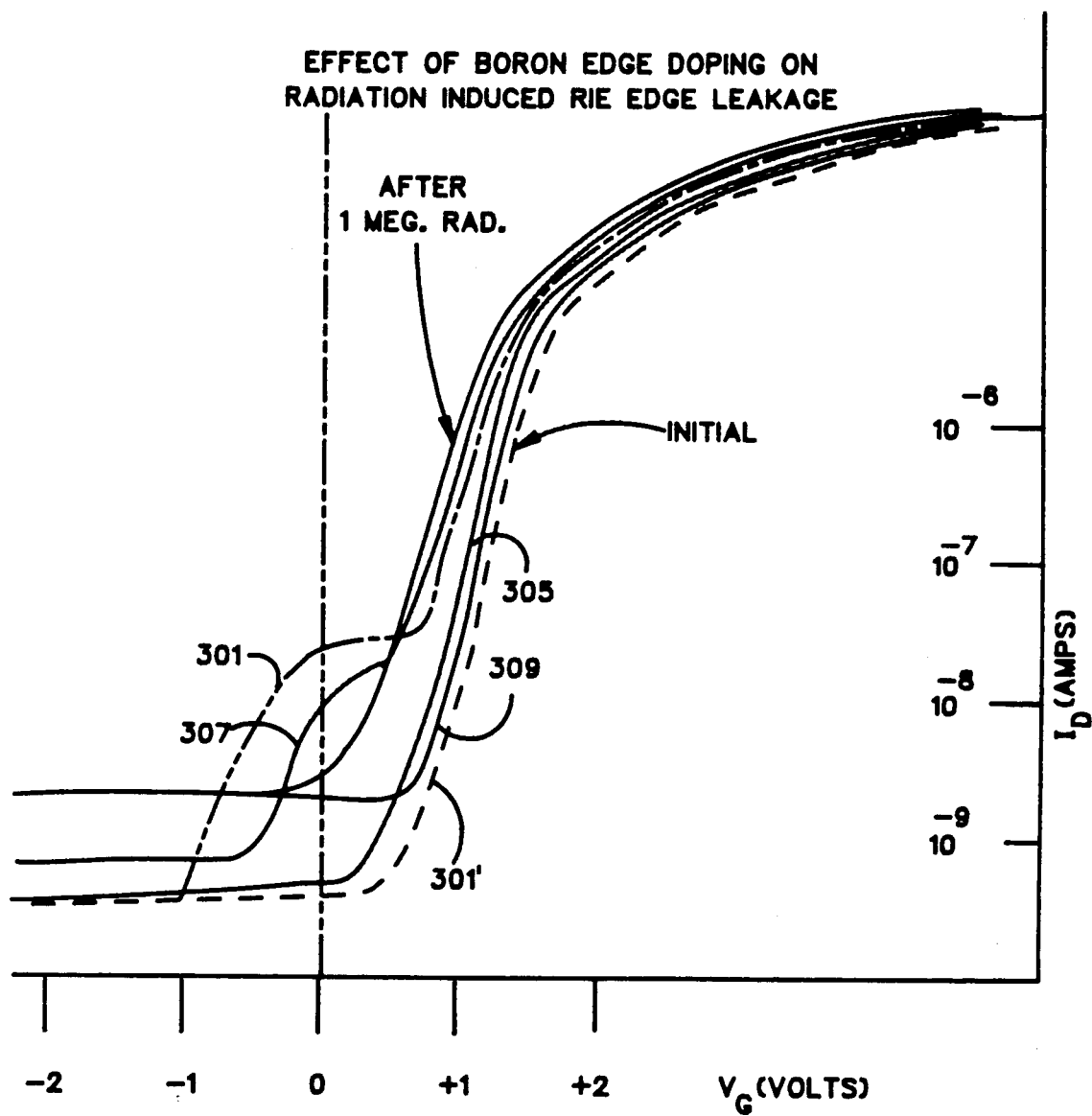
FIG. 25 is a series of curves showing the effect of boron edge doping on radiation induced RIE etch leakage for an NFET with no edge doping, an NFET with boron etch doping, and an NFET with boron implant etch doping.

In FIG. 25, the effect of boron edge doping on radiation induced reactive ion etch edge leakage is shown by three curves with the ordinant being $I_D$ in amperes and the abscissa being $V_G$ in volts. The curve 301 is obtained when no edge doping is utilized whatsoever, and note the large hump between $10^{-7}$ and $10^{-9}$ amperes. Curve 301 is taken after 1 megRAD of doping and its initial or nonexposed curve 301′ is shown on the far right. Thus, it is seen that a maximum discrepancy appears between the curves 301 and 301′ where there is no protective edge doping.

The next two sets of curves are the solid lines for boron edge doping, curve 305 without exposure and curve 307 after 1 megRAD exposure.

Finally, for the other boron option where the edge doping is implanted, curves 309 and 311 are compared with curves 311 and 307 showing the least displacement and the least humping proving the boron doping options of this invention to be effective.

What is claimed is:

1. A method for forming an edge hardened N type field effect transistor, comprising the steps of:

delineating an active region in an epitaxial layer of silicon on sapphire including a relatively thin thermal oxide layer on the silicon layer, a low temperature oxide layer over the thermal oxide, a silicon nitride layer over the thermal oxide, and a photoresist layer over the silicon nitride layer; said delineating including using reactive ion etching to verticalize the edges of the photoresist, thermal oxide, silicon nitride, and low temperature oxide layers;

multiple implanting boron ions into exposed portions of the silicon layer directly adjacent the active region at different energy levels between approximately 20 kilo electron volts and 50 kilo electron volts using doses of $10^{14}$–$10^{17}$ ions/cm$^2$ to provide a substantially uniform penetration of the silicon layer;

removing the photoresist layer;

driving in the boron ions to a depth of about 0.1 to 0.2 microns by heating in a nitrogen environment to approximately 850° C. for up to 2 hours;

using reactive ion etching to delineate the active region in the epitaxial layer and expose the edges being hardened;

conventionally finishing the forming of said transistor; and, using boro phospho silicate glass directly in contact with said edges for isolation purposes.

2. The method of claim 1, wherein:

the top of the epitaxial layer is disposed in the <100> crystallographic plane, and the edges are in the <110> or <111> plane.

3. A method for forming an edge hardened N type field effect transistor, comprising the steps of:

delineating an active region in an epitaxial layer of silicon on sapphire including a relatively thin thermal oxide layer on the silicon layer, a silicon nitride layer on the thermal oxide layer, a masking LPCVD silicon oxide layer on the silicon nitride and a photoresist layer over the LPCVD silicon oxide layer; said delineation including the active region in the epitaxial layer of silicon down to the sapphire by using reactive ion etching to form an island;

removing the photoresist and oxidizing the edges of the island using the silicon nitride layer as a mask;

selectively removing the oxide on the edges of the island;

establishing vapor diffusion of boron ions into the opposed edges of the island in a furnace with up to 0.2 micron penetration at least 800° C. for approximately 15 minutes;

conventionally finishing the forming of said transistor; and, using boro phospho silicate glass directly in contact with said edges for isolation purposes.

4. The method of claim 3, wherein:
the top of the epitaxial layer is disposed in the <100> crystallographic plane, and the edges are in the <110> or <111> plane.

5. The method of claim 3, wherein:
a source of boron is disposed in the furnace and the transistor being formed is disposed adjacent to the source.

6. The method of claim 3 wherein:
the transistor being formed is exposed to boron gas phase dopant.

* * * * *